US006933443B2

(12) United States Patent
Osthaus

(10) Patent No.: US 6,933,443 B2
(45) Date of Patent: Aug. 23, 2005

(54) METHOD FOR BONDING CERAMIC TO COPPER, WITHOUT CREATING A BOW IN THE COPPER

(75) Inventor: Bayard J. Osthaus, Richlandtown, PA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/766,352

(22) Filed: Jan. 28, 2004

(65) Prior Publication Data

US 2005/0163981 A1    Jul. 28, 2005

(51) Int. Cl.$^7$ ............................................... H05K 7/20
(52) U.S. Cl. ..................... 174/52.4; 361/707; 361/807; 257/712; 257/713
(58) Field of Search ................. 361/708, 707, 361/807; 174/52.4; 257/712, 713

(56) References Cited

U.S. PATENT DOCUMENTS

| 4,538,124 A | * | 8/1985 | Morrison ..................... 333/246 |
| 5,157,479 A | * | 10/1992 | Sekiguchi et al. .......... 257/728 |
| 5,161,093 A | * | 11/1992 | Gorczyca et al. ........... 361/795 |
| 5,602,720 A | * | 2/1997 | Natsuhara et al. .......... 361/708 |
| 5,745,984 A | * | 5/1998 | Cole et al. ..................... 29/834 |
| 5,774,342 A | * | 6/1998 | Brandenburg et al. ...... 361/774 |

* cited by examiner

Primary Examiner—Cathy F. Lam
(74) Attorney, Agent, or Firm—Eschweiler & Associates, LLC

(57) ABSTRACT

An electronic device and method of forming said device are presented, in which the device comprises a base having a pair of elongate flanges and a channel portion defined therebetween, wherein the channel portion has a substantially planar first surface, and wherein the pair of flanges extend generally perpendicularly from the first surface. The device further comprises a ceramic circuit board having a substantially planar second surface, wherein the second surface is substantially parallel to the first surface, and wherein the second surface is operable to mate with the first surface within the channel. An adhesive layer generally resides between the first surface and the second surface, wherein the adhesive layer fixedly couples the first surface of the base to the second surface of the circuit board, wherein the pair of flanges substantially maintain the planarity of the first surface and the second surface during a thermal expansion or contraction of one or more of the base and the circuit board.

50 Claims, 6 Drawing Sheets

METHOD FOR BONDING CERAMIC TO COPPER, WITHOUT CREATING A BOW IN THE COPPER

FIELD OF INVENTION

The present invention relates generally to circuit board packaging and more particularly to an apparatus and method for bonding a ceramic to a metal substrate.

BACKGROUND OF THE INVENTION

Modern electronic devices often include components which are bonded and packaged together for purposes such as heat dissipation, electrical grounding, or the like. For example, a circuit board can be bonded to a metal heat sink in order to dissipate heat associated with an operation of the circuit board. Conventional bonding techniques, for example, comprise utilizing a thermal-set adhesive, wherein the circuit board is bonded to the heat sink by an application of heat to the entire electronic device, therein curing the thermal-set adhesive at a substantially high temperature. Such high-temperature curing, however, can have deleterious effects on a planarity of the circuit board once the device is cooled.

For example, FIGS. 1A and 1B illustrate an exemplary conventional electronic device 10 in various stages of fabrication. The electronic device 10 comprises a circuit board 15 and a metal heat sink 20, wherein an adhesive layer 25 resides therebetween. Typically, the circuit board 15 and heat sink 20 have differing coefficients of thermal expansion, wherein the circuit board typically expands and contracts significantly less than the heat sink upon a respective application and removal of heat to the device 10. In FIG. 1A, the circuit board 15 and heat sink 20 are illustrated prior to heating, wherein the adhesive layer 25 is generally un-cured, thus allowing a movement between the circuit board and the heat sink. In the un-cured state, the circuit board 15 and heat sink 20 are generally planar and parallel to one another. In order to cure the adhesive layer 25, the device 10 is heated, and the exemplary circuit board 15 and heat sink 20 generally expand at differing rates. However, since the adhesive layer 25 generally remains in a pliable state below a predetermined cure temperature, the circuit board 15 and heat sink 20 are generally permitted to expand with respect to one another, thus maintaining the planarity when the adhesive is still un-cured.

Once the adhesive layer 25 cures at the predetermined cure temperature, however, the circuit board 15 and heat sink 20 are generally fixed with respect to one another by the cured adhesive. Thus, during a cooling of the device 10, the circuit board 15 and heat sink 20 contract (again, since the circuit board and heat sink have differing coefficients of thermal expansion), generally causing a build-up of stress between the circuit board and heat sink. FIG. 1B illustrates a result of the stress build up, wherein the heat sink 20 generally warps with respect to the circuit board 15 due to the stresses imposed between the heat sink and circuit board. Depending on the elasticity of the adhesive layer 25 and the stiffness of the circuit board 15 and the heat sink 20, for example, an amount of warpage 30 can result, thus leaving the device generally non-planar. Alternatively, the bond between the circuit board 15 and the heat sink 20 by the adhesive layer 25 can succumb to the stresses, thus delaminating the device.

Accordingly, there is a need for improved packaging by which the shortcomings of traditional packaging can be mitigated.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to circuit board packaging, and more particularly, relates to an apparatus and method for bonding a ceramic circuit board to a base, wherein the circuit board and the base have differing coefficients of thermal expansion. One aspect of the invention provides an electronic device, wherein the device comprises a base, a ceramic circuit board, and an adhesive layer disposed therebetween. According to one exemplary aspect, the base comprises a pair of elongate flanges, wherein the circuit board resides within a channel defined by the flanges. The ceramic circuit board and the channel comprise respective planar surfaces, wherein the surfaces of the circuit board and the channel are fixedly coupled by the adhesive.

The pair of flanges, according to one example, are operable to substantially maintain a planarity of the surfaces of the circuit board and the channel. In accordance with another aspect of the invention, the circuit board and the base have differing coefficients of thermal expansion, wherein the pair of flanges are further operable to maintain a planarity of the surfaces of the circuit board and the base during an expansion or contraction of one or more of the base and the circuit board.

Another aspect of the invention relates to a method of forming an electronic device, wherein a metal base and a ceramic circuit board are provided, wherein the base and the circuit board have differing coefficients of thermal expansion. In accordance with one exemplary aspect of the invention, a channel is formed in the base, wherein the channel has a length, width, and depth associated with a respective length, width, and depth of the ceramic circuit board, and wherein a pair of flanges are generally defined along the length of the channel. An adhesive layer is applied onto one or more of the channel and circuit board, and the circuit board is placed within the channel. According to one exemplary aspect of the invention, the adhesive comprises a thermal-set epoxy.

The base, circuit board, and the adhesive are heated to a predetermined temperature, wherein the base and the circuit board thermally expand by differing amounts during heating. Furthermore, the adhesive substantially cures at the predetermined temperature. The base, circuit board, and the adhesive, are further cooled, wherein the base and the circuit board thermally contract by differing amounts. The differing amounts of contraction generally induces a stress between the base and the circuit board, and the pair of flanges advantageously restricts a flexure of the base and the circuit board caused by the induced stress.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1A:
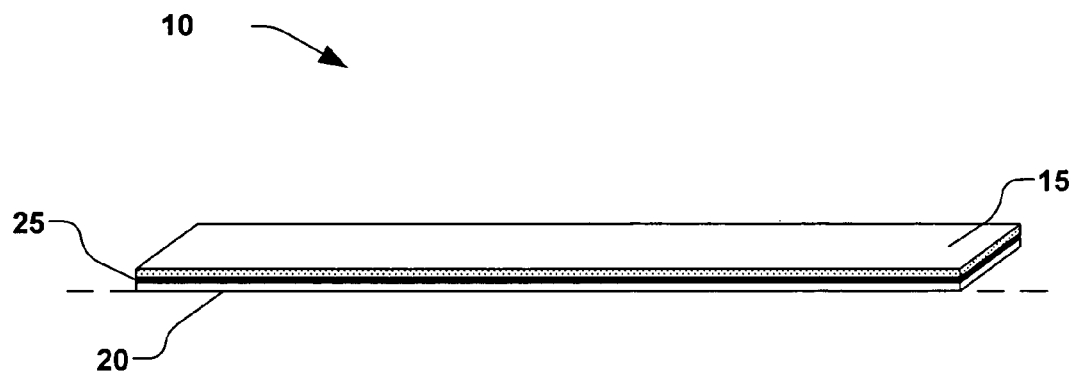
FIG. 1A is a perspective view of an exemplary electronic device of the prior art prior to a curing of an adhesive layer.
Figure 1B:
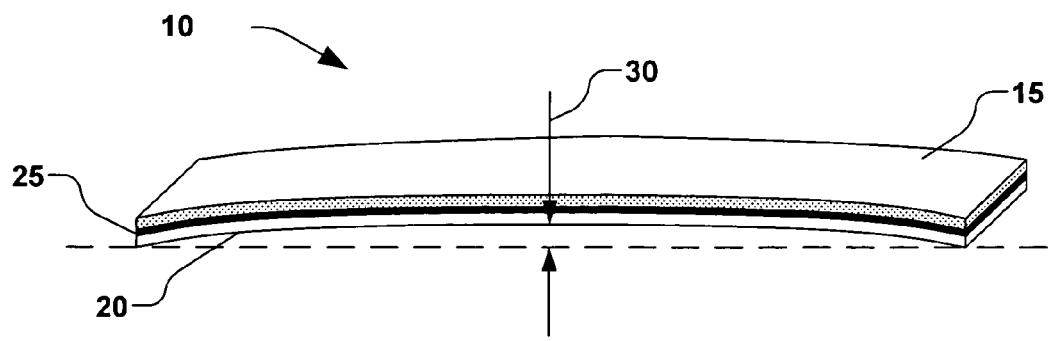
FIG. 1B is a perspective view of the exemplary electronic device of FIG. 1A after a curing of the adhesive layer.

The present invention relates generally to electronic device packaging, wherein materials having differing coefficients of thermal expansion are bonded together. Accordingly, one or more implementations of the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
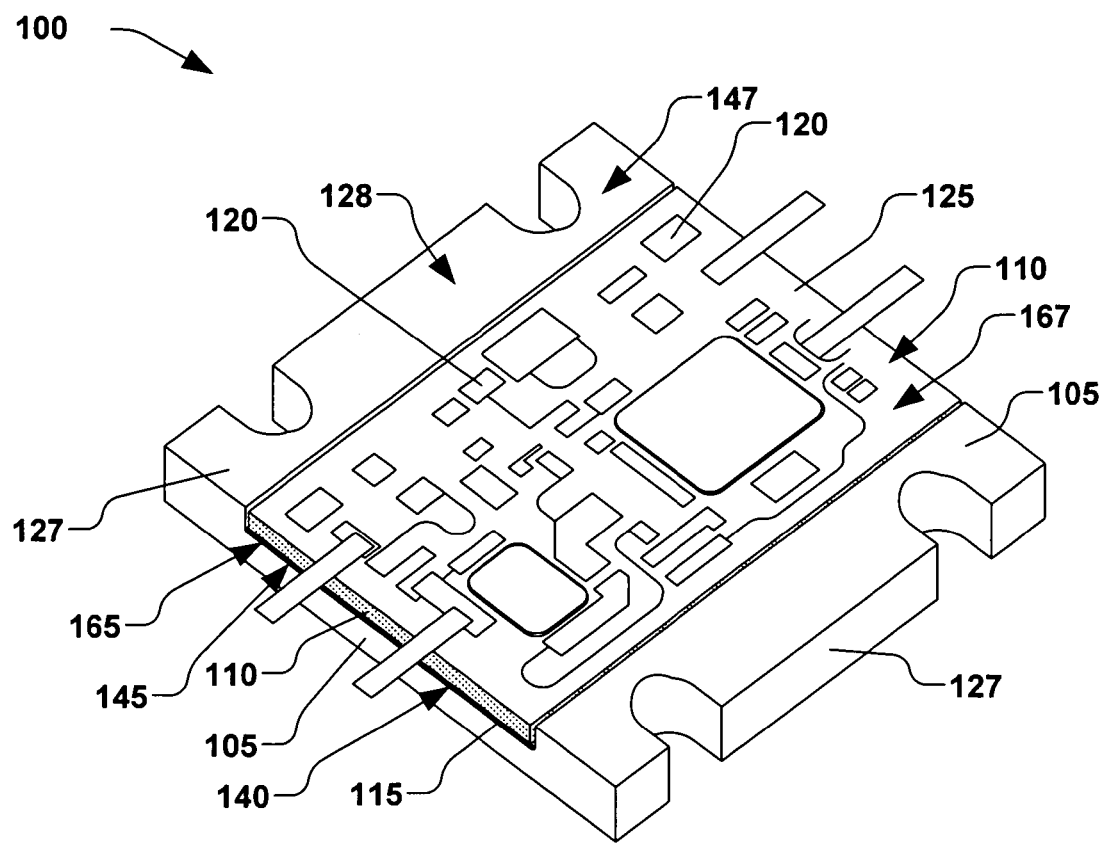
FIG. 2 is a perspective view of an assembled electronic device according to an exemplary aspect of the invention.

Referring now to the figures, FIG. 2 illustrates an electronic device 100 according to one exemplary aspect of the present invention. The electronic device 100, for example, comprises a base 105, a circuit board 110, and an adhesive layer 115 disposed therebetween, wherein the adhesive layer substantially bonds the circuit board to the base. The circuit board 110, for example, comprises electronic circuitry 120 which is embedded into, or residing on, a ceramic substrate 125, wherein the ceramic substrate has a substantially low coefficient of thermal expansion (CTE) (e.g., a CTE of approximately 6 ppm ° C.). The base 105, for example, is comprised of a metal, wherein the metal is substantially thermally conductive and has a substantially high CTE (e.g., a CTE of approximately 16 ppm ° C.). A significant difference in CTE between the base 105 and the circuit board 110, however, can lead to stresses developing in one or more of the base and circuit board during, for example, a thermal curing process of the adhesive layer 115. In a case where a thermally-cured epoxy is utilized as the adhesive layer 115, substantial expansion of the base 105 can occur, while the circuit board 110 expands to a far lesser degree. Such a mis-match of CTEs, therefore, can lead to undesirable flexure of the device 100 once the thermally-cured epoxy sets and the device is cooled. The present invention advantageously utilizes a geometry of the base 105 in order to mitigate a flexure in one or more of the base and circuit board 110 caused by the stresses, as will be discussed hereafter.

The base 105, for example, is comprised of a contiguous piece of metal 127, such as a plate of copper or copper alloy (e.g., an alloy of copper and zirconium), wherein the metal is operable to provide a substantial amount of thermal energy transfer between the circuit board 110 and the base during an operation of the electronic device 100 (e.g., the base can act as a heat sink for the circuit board). According to another aspect of the invention, the base 105 of FIG. 3 may be further coated with one or more supplemental metal coatings 128 wherein the one or more supplemental metal coatings generally provides various advantages for the device 100. For example, the one or more metal coatings 128 provide a high degree of electrical conductivity between the base 105 and the circuit board 110, or between the base and adjoining structures (not shown) (e.g., between the base and an electrical ground). The one or more supplemental metal coatings 128, for example, may further provide a generally non-corrosive interface for electrical connection to the adjoining structures or other devices (not shown). Accordingly, the one or more metal coatings 128 may comprise a layer of approximately 0.15 microinches of one or more metals such as gold and/or nickel, wherein the metal coating provides a highly electrically conductive interface between the base and adjoining structures.

Figure 3:
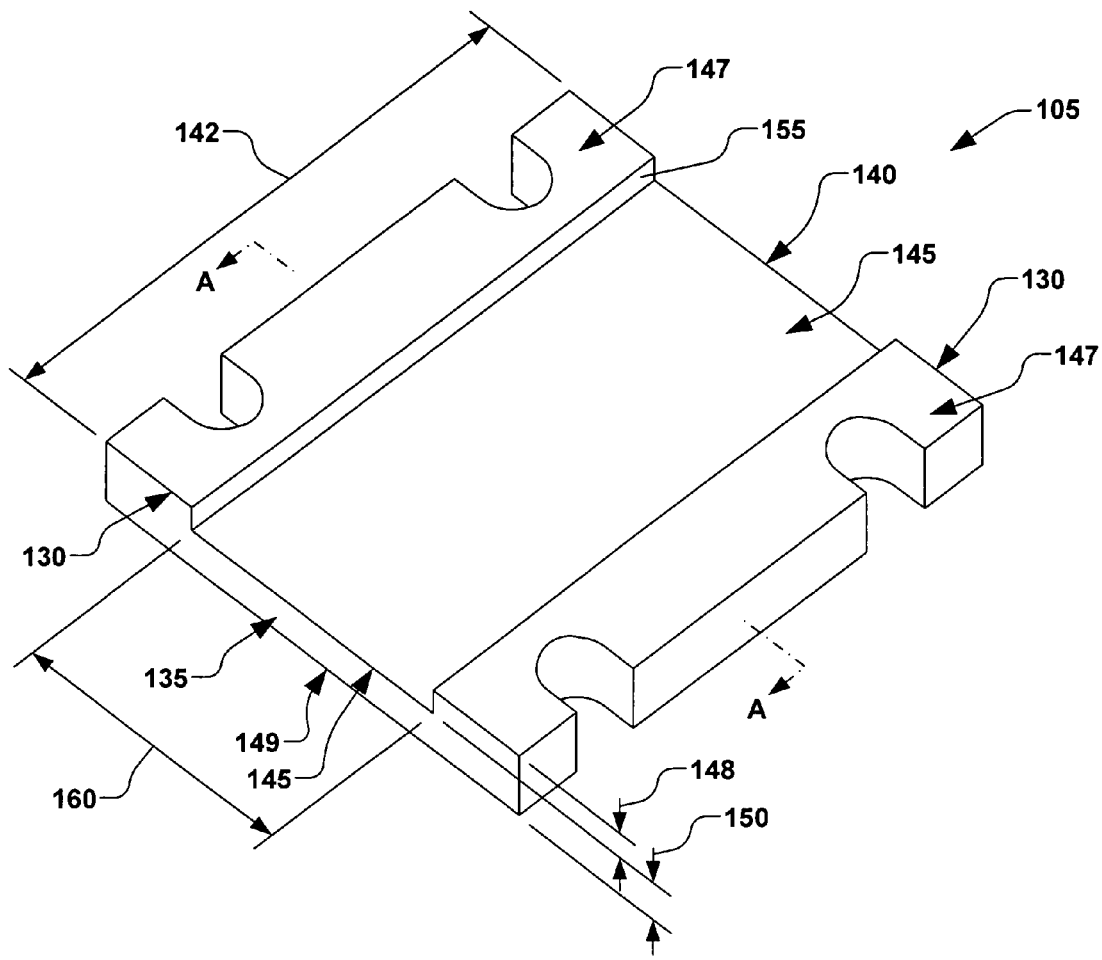
FIG. 3 is a perspective view of a base plate according to one exemplary aspect of the present invention.

FIG. 3 illustrates a perspective view of the base 105 according to one exemplary aspect of the invention, wherein the base is generally defined by one or more elongate flanges 130 and a recessed portion 135. According to a first embodiment of the present invention, the base 105 comprises a pair of flanges 130 which are generally separated from one another by the recessed portion 135, wherein the recessed portion generally defines an elongate channel 140 between the flanges along a length 142 of the base. The channel 140, for example, comprises a substantially planar first surface 145, wherein the first surface is generally recessed from a top surface 147 of at least one of the flanges 130 by a predetermined first distance 148 (e.g., a channel depth). In other words, the flanges 130 can be considered to extend outwardly from the first surface 145 of the channel 140, wherein at least one of the flanges extends the first distance 148 from the first surface (e.g., equal to the depth of the channel 140).

The first surface 145, for example, is generally parallel to a substantially planar bottom surface 149 of the base 105, wherein the first surface and the bottom surface of the base are separated by a second predetermined distance 150. It should be noted that whereas the first surface 145 and bottom surface 149 are described as substantially planar, variations in topography of the first surface and bottom surface, such as islands, indentations, slots, roughened surfaces, or the like (not shown) may be present, and such variations are contemplated as falling within the scope of the present invention. Consequently, with respect to the present invention, the first surface 145 of the channel 140 and the bottom surface 149 of the base 105, when viewed as a whole, can be considered substantially planar.

In the first embodiment of the present invention, the pair of flanges 130 extend generally perpendicularly outward from the first surface 145 along the length 142 of the base. Furthermore, the flanges 130 generally define channel walls 155 adjacent to the first surface 145, wherein the channel walls are generally separated from one another by a predetermined channel width 160 along the length 142 of the base 105. The exemplary base 105 of FIG. 3 is further illustrated in cross section A—A in FIG. 4 for clarity, wherein the flanges 130 are further defined by a flange width 161. The channel 140, for example, is formed by machining or stamping the base 105, as will be discussed infra.

Figure 4:
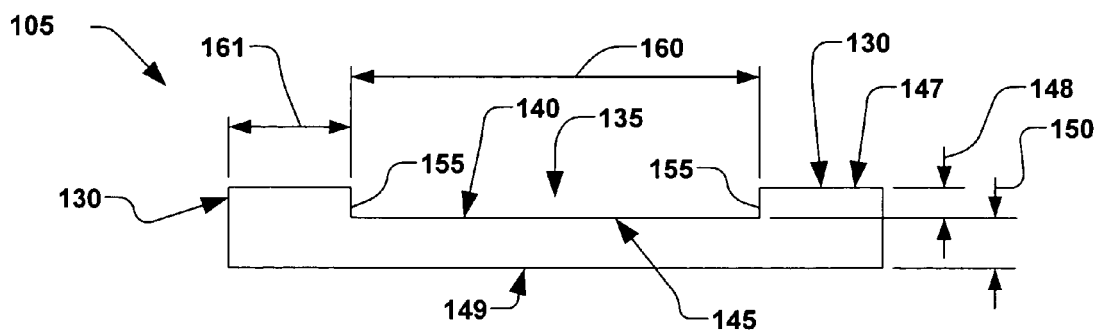
FIG. 4 is a cross-sectional view of a portion of the base plate of FIG. 2.
Figure 5:
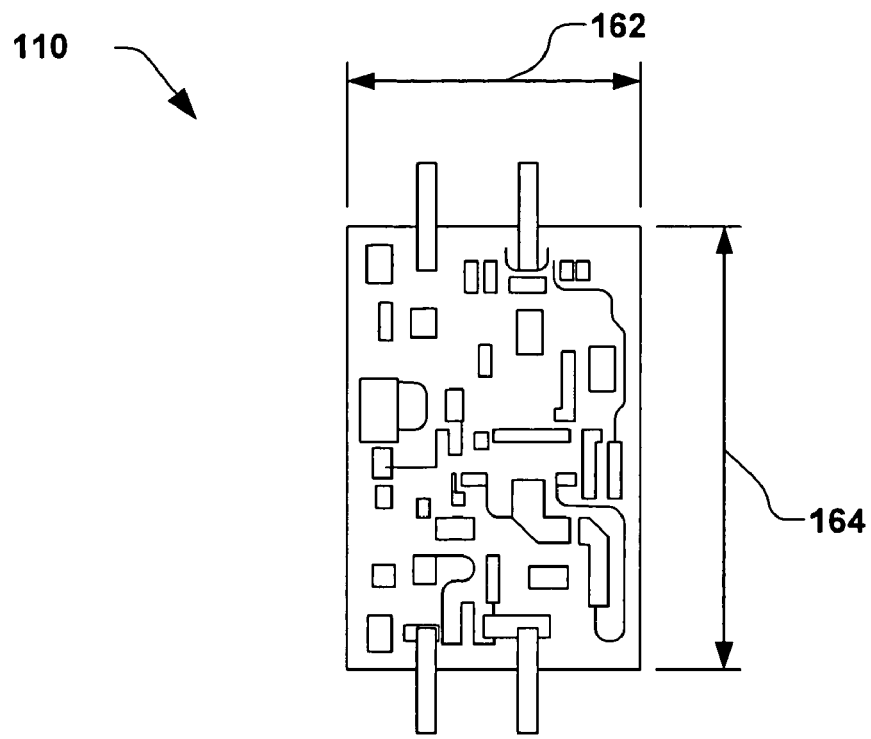
FIG. 5 is a plan view of an exemplary circuit board according to another aspect of the present invention.
Figure 6:
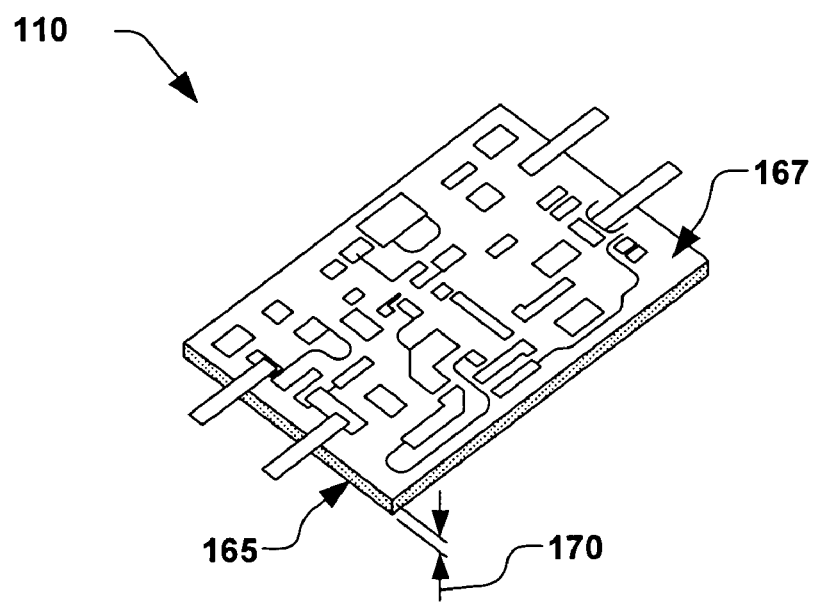
FIG. 6 is a perspective view of the exemplary circuit board of FIG. 5.

The predetermined channel width 160 of FIGS. 3 and 4, according to one aspect of the invention, is sized such that the circuit board 110 of FIG. 2 is operable to reside within the channel 140. For example, FIG. 5 illustrates a plan view of an exemplary circuit board 110, wherein the circuit board is generally defined by a width 162 and a length 164. The width 162 and length 164 of the circuit board, for example, are slightly smaller than the respective channel width 160 and length 142 of FIGS. 3 and 4, wherein the circuit board is operable to be positioned within the channel 140 prior to a curing of the adhesive layer 115 (thus, prior to an expansion or contraction of the base 105 or circuit board 110). For example, the width of the circuit board 110 is sized such that a small clearance (e.g., a clearance of about 0.020 inches) exists between the circuit board and the channel walls 155. FIG. 6 illustrates the circuit board 110 of FIG. 5 in perspective view, wherein according to another example, the circuit board 110 comprises a substantially planar second surface 165 (e.g., a bottom surface of the circuit board) and a third surface 167 (e.g., a top surface of the circuit board), thus defining a thickness 170 of the circuit board therebetween. Furthermore, as illustrated in FIG. 2, the second surface 165 of the circuit board 110, when assembled in the device 100, is substantially parallel to the first surface 145 of the channel.

In accordance with another aspect of the present invention, the thickness 170 of the circuit board is associated with the with first distance 148 of FIGS. 3 and 4. For example, the sum of the thickness 170 of the circuit board 110 of FIG. 6 and a thickness (not shown) of the adhesive layer 115 of FIG. 2 are approximately equal to the first distance 148 (e.g., the channel depth) of FIGS. 3 and 4. In one example, the thickness of the adhesive layer 115 can be considered negligible with respect to the thickness 170 of the circuit board 110, wherein the thickness of the circuit board is approximately equal to the first distance 148. Therefore, in the exemplary device 100 illustrated in FIG. 2, the top surface 167 of the circuit board 110 is approximately coplanar with the top surface 147 of the flanges 130. It should be noted, however, that the thickness 170 of the circuit board 110 illustrated in FIG. 6 may differ from the first distance 148 of FIGS. 3 and 4, while still falling within the scope of the present invention.

According to one aspect of the present invention, the first distance 148 (e.g., a height of the flanges 130), as illustrated in FIGS. 3 and 4, advantageously provides a stiffening effect to the device 100 of FIG. 2 during thermal expansion and contraction, and evenly distributes stresses involved therein. As discussed earlier, when the circuit board 110 and the base 105 have differing CTEs, the circuit board and base expand and contract by differing amounts when heated to a predetermined temperature. Conventionally, planar base plates were utilized, wherein the base plates were at least five times as thick as the thickness of the circuit board in order to avoid warpage of the base plate or circuit board during expansion and contraction (e.g., when a high-strength epoxy was utilized as the adhesive). Such large thicknesses, however, are typically costly in terms of both material usage and device footprint. Alternatively, silicone-based adhesives were utilized, wherein the silicone provided an amount of elasticity between the base plate and the circuit board, thus preventing warpage. However, silicone-based adhesives typically have significantly lower bond strengths than epoxies, thus leading to potential delamination of the circuit board from the base plate. The flanges 130 of FIG. 3 of the present invention, on the other hand, advantageously stiffen the base plate 105, while evenly distributing stresses across the first surface 145 of the channel 140.

For example, the adhesive layer 115 of FIG. 2 comprises a thermal-set epoxy, wherein the epoxy has a Young's Modulus number on the order of 80 MPa. Alternatively, the adhesive layer 115 comprises a silicone adhesive, a thermal-set adhesive, or any other adhesive operable to substantially bond the circuit board 110 to the base 105. The adhesive layer 115, for example, may further comprise silver or a silver alloy, wherein electrical and/or thermal conductivity between the base 105 and the circuit board 110 can be enhanced. In order to cure (i.e., thermally set) the adhesive layer 115 comprising a thermal-set epoxy, for example, the device 100 is heated to a glass transition temperature, wherein the epoxy changes adhesive properties from being substantially non-adhesive to substantially adhesive in nature. For example, a glass transition temperature of approximately 100° C. is typical for a thermal-set epoxy, wherein upon heating the device 100 to the glass transition temperature, the base 105 and the circuit board are thermally expanded by differing amounts. Upon a cooling of the device 100 (e.g., a cooling of the device to room temperature), stresses (not shown) within the base 105 and circuit board 110 are advantageously evenly distributed across the first surface 145 of FIG. 3, wherein the even distribution of stress is due, at least in part, to the flanges 130 extending the first distance 148 beyond the first surface. By having the flanges 130 distribute the stresses across the first surface 145, the present invention advantageously permits the second distance 150 to be significantly less than five times the thickness 170 of the circuit board 110 of FIG. 6. For example, the first distance 148, the second distance 150, and the thickness 170 of the circuit board 110 are approximately equal. The flange width 161 of FIG. 4, for example, can be further adjusted in order to provide further rigidity.

Figure 7:
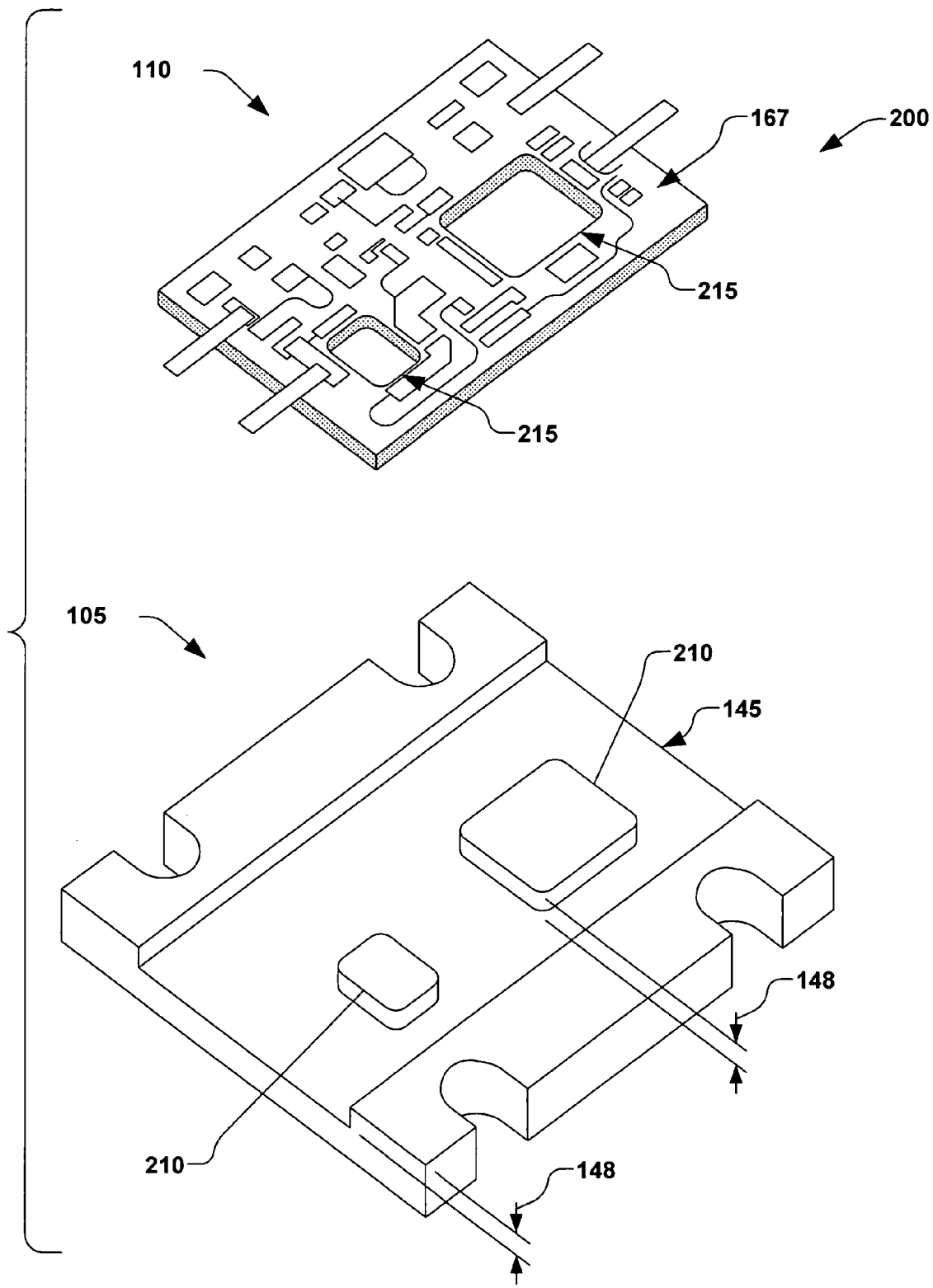
FIG. 7 is an exploded perspective view of an exemplary electronic device according to another aspect of the present invention.

In accordance with a second embodiment of the present invention, FIG. 7 illustrates an exploded perspective view of another exemplary device 200, wherein the base 105 further comprises one or more secondary structures 210. The one or more secondary structures 210, for example, extend generally perpendicularly to the first surface 145 by a distance approximately equal to the first distance 148. The circuit board 110, for example, further comprises one or more secondary cavities 215, wherein the one or more secondary structures 210 are operable to generally reside within the respective one or more secondary cavities in the circuit board when the base 105 is fixedly coupled to the circuit board. The one or more secondary structures 210, for example, are further operable to provide a stress distribution along the first surface 145 during expansion and contraction of the base 105 and/or circuit board 110 as discussed above. The one or more secondary structures 210 are further operable to provide a degree of self-fixturing when the circuit board 110 is placed on the base, wherein the secondary structures align with the secondary cavities, thus minimizing additional alignment fixtures during assembly of the device 200. The one or more secondary structures 210 further provide additional heat sink possibilities for secondary circuit boards (not shown) which may be aligned to the top surface 167 of the circuit board 110 in subsequent devices (not shown) comprising the device 200.

Figure 8:
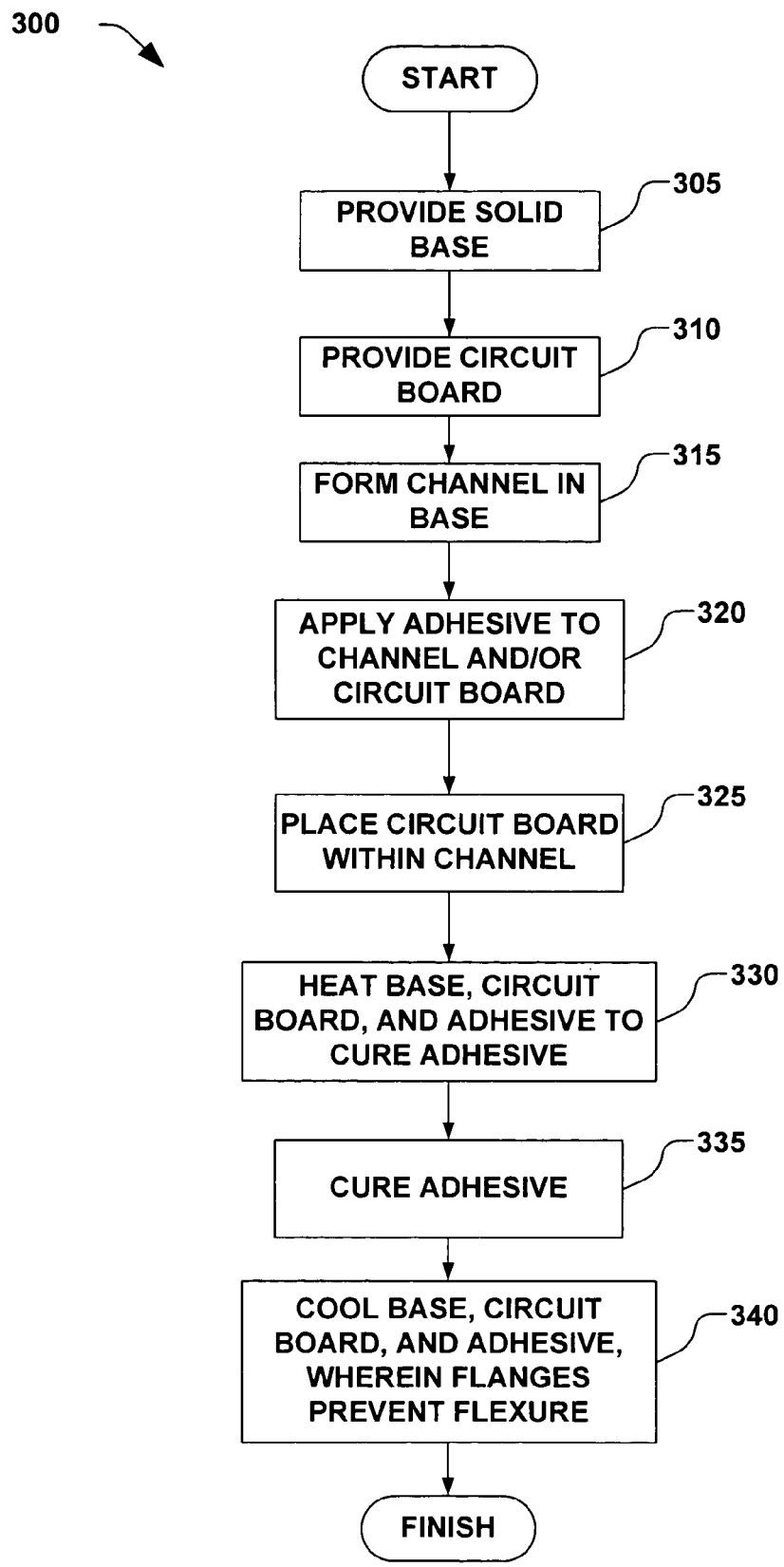
FIG. 8 is a block diagram of an exemplary method of forming an exemplary electronic device according to another aspect of the present invention.

According to still another exemplary aspect of the present invention, FIG. 8 is a schematic block diagram of an exemplary method 300 illustrating a formation of an exemplary electronic device. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 8 the method 300 begins with providing a substantially solid base in act 305 having a length, a width, and a depth. The provided circuit board is further associated with a first coefficient of thermal expansion. A circuit board is provided in act 310, wherein the circuit board has a length, a width, and a depth associated therewith, and wherein the circuit board is further associated with a second coefficient of thermal expansion. For example, the second CTE differs significantly from the first CTE. A channel is formed in the base in act 315, wherein the channel has a length, a width, and a depth associated with the respective length, width, and depth of the ceramic circuit board. The channel further comprises a first surface along the depth of the channel, wherein a pair of flanges extend generally perpendicularly from the first surface along the length of the channel. According to one example, the channel is formed by machining or stamping the base in a predetermined manner.

In act 320, an adhesive layer is applied onto one or more of the channel and circuit board. For example, the adhesive layer is applied to the first surface of the channel. The circuit board is then placed within the channel in act 325, wherein the a second surface of the surface board contacts the adhesive layer, and wherein the adhesive layer resides between the first surface and the second surface.

The base, circuit board, and adhesive are heated to a predetermined temperature in act 330, wherein the base and the circuit board thermally expand by differing amounts during heating. At the predetermined temperature, the adhesive substantially cures in act 335, wherein the base and the circuit board are fixedly coupled to one another. Consequently, in act 340, the base, circuit board, and adhesive are cooled, wherein the base and the circuit board thermally contract by differing amounts, therein inducing a stress between the base and the circuit board. During the cooling, however, the pair of flanges substantially restrict a flexure of the base and the circuit board caused by the induction of stress.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An electronic device, comprising:
   a base comprising a pair of elongate flanges and a channel portion therebetween, the channel portion having a substantially planar first surface, wherein the pair of flanges extend generally perpendicularly from the first surface, and wherein the pair of flanges are separated by a predetermined channel width;
   a ceramic circuit board comprising a substantially planar second surface, wherein the second surface is substantially parallel to the first surface and operable to mate with the first surface within the channel width; and
   an adhesive layer generally residing between the first surface and the second surface, wherein the adhesive layer fixedly couples the first surface of the base to the second surface of the circuit board,
   wherein the pair of flanges are operable to substantially maintain the planarity of the first surface and the second surface during a thermal expansion or contraction of one or more of the base and the circuit board, wherein the base is associated with a first coefficient of thermal expansion and the circuit board is associated with a second coefficient of thermal expansion, and wherein the first coefficient of thermal expansion and the second coefficient of thermal expansion are dissimilar.

2. The device of claim 1, wherein the circuit board further comprises a third surface, wherein a thickness of the circuit board is measured between the second surface and the third surface, and wherein at least one of the pair of flanges extends a first distance from the first surface, wherein the first distance is associated with the thickness of the circuit board.

3. The device of claim 2, wherein the first distance is greater than or approximately equal to the thickness of the circuit board.

4. The device of claim 2, wherein first distance is greater than or approximately equal to a sum of the thickness of the circuit board and a thickness of the adhesive layer.

5. The device of claim 2, wherein the pair of flanges extend the first distance from the first surface.

6. The device of claim 2, wherein the base further comprises a bottom surface, wherein a second distance is measured between the first surface and the bottom surface of the base, and wherein the second distance is further associated with the thickness of the circuit board.

7. The device of claim 6, wherein the second distance is less than five times the thickness of the circuit board.

8. The device of claim 6, wherein the bottom surface of the base is generally parallel to the first surface.

9. The device of claim 1, wherein the base is a contiguous piece of metal.

10. The device of claim 1, wherein the pair of flanges extend along a length of the channel, wherein the length of the channel is greater than or approximately equal to a length of the circuit board.

11. The device of claim 1, wherein the first coefficient of thermal expansion is greater than the second coefficient of thermal expansion.

12. The device of claim 1, wherein the base is comprised of copper or a copper alloy.

13. The device of claim 12, wherein the base is comprised of an alloy of copper and zirconium.

14. The device of claim 1, wherein the base is coated with one or more metal coatings.

15. The device of claim 14, wherein the one or more metal coatings comprise one or more of gold or nickel.

16. The device of claim 14, wherein a thickness of the one or more metal coatings is approximately 0.15 microinches.

17. The device of claim 1, wherein the adhesive layer is electrically conductive.

18. The device of claim 17, wherein the adhesive layer comprises silver or a silver alloy.

19. The device of claim 1, wherein the adhesive layer has a modulus of elasticity of about 80 MPa.

20. The device of claim 1, wherein the adhesive layer comprises a thermal-set epoxy.

21. The device of claim 1, wherein the base further comprises one or more secondary structures which extend generally perpendicularly to the first surface, and wherein the circuit board comprises one or more secondary cavities therein, wherein the one or more secondary structures are operable to generally reside within the respective one or more secondary cavities when the base is fixedly coupled to the circuit board.

22. An electronic device, comprising:
a metal base comprising a channel portion having a substantially planar first surface, the base further comprising a pair of flanges and one or more secondary structures which extend outwardly from the first surface, wherein a pair of flanges extend along a length of the first surface and are separated by a predetermined width, therein defining a channel therebetween;
a ceramic circuit board having a substantially planar second surface which is substantially parallel to the first surface, wherein the circuit board is generally defined by a length and a width, wherein the length and width of the circuit board are smaller than the respective length and width of the channel, wherein the circuit board resides within the channel; and
an epoxy layer generally residing between the first surface and the second surface, wherein the epoxy layer fixedly couples the first surface of the base to the second surface of the circuit board within the channel,
wherein the pair of flanges are operable to substantially maintain the planarity of the first surface and the second surface during a thermal expansion or contraction of one or more of the base and the circuit board.

23. The device of claim 22, wherein the pair of flanges and the one or more secondary structures extend generally perpendicularly to the first surface.

24. The device of claim 22, wherein the circuit board further comprises a third surface, wherein a thickness of the circuit board is measured between the second surface and the third surface, and wherein at least one of the pair of flanges extends a first distance from the first surface, wherein the first distance is associated with the thickness of the circuit board.

25. The device of claim 24, wherein the first distance is greater than or approximately equal to the thickness of the circuit board.

26. The device of claim 24, wherein first distance is greater than or approximately equal to a sum of the thickness of the circuit board and a thickness of the epoxy layer.

27. The device of claim 24, wherein the pair of flanges extend the first distance from the first surface.

28. The device of claim 24, wherein the base further comprises a bottom surface, wherein a second distance is measured between the first surface and the bottom surface of the base, and wherein the second distance is further associated with the thickness of the circuit board.

29. The device of claim 28, wherein the second distance is less than five times the thickness of the circuit board.

30. The device of claim 28, wherein the bottom surface of the base is generally parallel to the first surface.

31. The device of claim 22, wherein the metal base is a contiguous piece of metal.

32. The device of claim 22, wherein the pair of flanges extend along a length of the channel, wherein the length of the channel is greater than or approximately equal to a length of the circuit board.

33. The device of claim 22, wherein the base is associated with a first coefficient of thermal expansion and the circuit board is associated with a second coefficient of thermal expansion, wherein the first coefficient of thermal expansion and the second coefficient of thermal expansion are dissimilar.

34. The device of claim 33, wherein the first coefficient of thermal expansion is greater than the second coefficient of thermal expansion.

35. The device of claim 22, wherein the base is comprised of copper or a copper alloy.

36. The device of claim 22, wherein the base is comprised of an alloy of copper and zirconium.

37. The device of claim 22, wherein the base is coated with one or more metal coatings.

38. The device of claim 37, wherein the one or more metal coatings comprise one or more of gold or nickel.

39. The device of claim 37, wherein a thickness of the one or more metal coatings is approximately 0.15 microinches.

40. The device of claim 22, wherein the epoxy layer is electrically conductive.

41. The device of claim 40, wherein the epoxy layer comprises silver or a silver alloy.

42. The device of claim 22, wherein the epoxy has a modulus of elasticity of approximately 80 MPa.

43. The device of claim 22, wherein the circuit board comprises one or more secondary cavities therein, wherein the one or more secondary structures are operable to generally reside within the respective one or more secondary cavities when the base is fixedly coupled to the circuit board.

44. An electronic device, comprising:
a base having a channel and a flange defined therein;
a circuit board, wherein the base and the circuit board have dissimilar coefficients of thermal expansion; and
an adhesive, wherein the base and circuit board are fixedly coupled to one another by the adhesive, and wherein the flange is operable to substantially maintain a planarity of the circuit means and the base during a thermal expansion or contraction of one or more of the base and the circuit board.

45. The device of claim 44, wherein the base comprises one or more metals or a metal alloy.

46. The device of claim 44, wherein the circuit board comprises a ceramic circuit board having a low coefficient of thermal expansion.

47. The device of claim 44, wherein the flange comprises at least two flanges, wherein the channel is defined therebetween.

48. The device of claim 47, wherein a size of the channel is associated with a size of the circuit board.

49. The device of claim 44, wherein the adhesive comprises an epoxy having a high modulus of elasticity.

50. An electronic device, comprising:
a base having a channel and a flange defined therein;
a circuit board, wherein a thickness of the base is less than five times a thickness of the circuit board; and
an adhesive, wherein the base and circuit board are fixedly coupled to one another by the adhesive, and wherein the flange is operable to substantially maintain a planarity of the circuit board and the base during a thermal expansion or contraction of one or more of the base and the circuit board.

* * * * *

UNITED STATES PATENT AND TRADEMARK OFFICE
CERTIFICATE OF CORRECTION

PATENT NO. : 6,933,443 B2
DATED : August 23, 2005
INVENTOR(S) : Bayard J. Osthaus It is certified that error appears in the above-identified patent and that said Letters Patent is hereby corrected as shown below:

Column 10,
Line 53, please replace the word "means" with the word -- board --.

Signed and Sealed this

Fifteenth Day of November, 2005

JON W. DUDAS
*Director of the United States Patent and Trademark Office*